United States Patent [19]

MacDiarmid et al.

[11] 4,442,187

[45] Apr. 10, 1984

[54] BATTERIES HAVING CONJUGATED POLYMER ELECTRODES

[75] Inventors: Alan G. MacDiarmid, Drexel Hill; Alan J. Heeger, Wynnewood; Paul J. Nigrey, Philadelphia, all of Pa.

[73] Assignee: University Patents, Inc., Norwalk, Conn.

[21] Appl. No.: 220,496

[22] Filed: Dec. 29, 1980

Related U.S. Application Data

[63] Continuation-in-part of Ser. No. 129,439, Mar. 11, 1980, Pat. No. 4,321,114.

[51] Int. Cl.$^3$ .............................................. H01M 4/60
[52] U.S. Cl. .................................................... 429/213
[58] Field of Search ................ 429/213, 212, 191, 199

[56] References Cited

U.S. PATENT DOCUMENTS

| | | | |
|---|---|---|---|
| 3,352,720 | 11/1967 | Wilson et al. | 429/213 |
| 3,660,163 | 5/1972 | Moser | 136/83 R |
| 4,148,976 | 4/1979 | Sekido et al. | 429/191 |

FOREIGN PATENT DOCUMENTS

| | | | |
|---|---|---|---|
| 1216549 | 12/1970 | United Kingdom | 429/213 |

OTHER PUBLICATIONS

Yoshimura, Molecular Metals, Edited by W. E. Hatfield, NATO Conf. Series VI, Materials Science, 1978, pp. 471–489.

*Primary Examiner*—Charles F. LeFevour
*Attorney, Agent, or Firm*—Woodcock, Washburn, Kurtz, Mackiewicz & Norris

[57] ABSTRACT

Conjugated polymers are doped with ionic dopant species to a preselected room temperature electrical conductivity ranging from that characteristic of semiconductor behavior to that characteristic of metallic behavior, by means of reversible electrochemical doping procedures. The doping procedures are carried out in an electrochemical cell wherein the polymer to be doped is employed as one or both of the electrodes, and the electrolyte is a compound which is ionizable into the ionic dopant species. Upon operation of the cell, the polymer, if used as the anode, becomes doped with an anionic dopant species to a p-type material; or if used as the cathode, becomes doped with a cationic dopant species to an n-type material.

The electrochemical doping reactions and their reverse electrochemical undoping reactions are utilized as the charging and discharging mechanisms of novel lightweight secondary batteries which employ doped or dopable conjugated polymers as one or both of their electrodes.

20 Claims, No Drawings

4,442,187

BATTERIES HAVING CONJUGATED POLYMER ELECTRODES

The invention described herein was made in course of work under grants or awards from the Office of Naval Research and the National Science Foundation.

This application is a continuation-in-part of application Ser. No. 129,439, filed Mar. 11, 1980, now U.S. Pat. No. 4,321,114, issued Mar. 23, 1982.

BACKGROUND OF THE INVENTION

This invention relates to electrochemical doping procedures for the selective modification of the room temperature electrical conductivity properties of conjugated polymers, and to the application of such procedures in the design of novel lightweight high energy density and high power density secondary batteries.

For use in a wide variety of electrical and electronic device applications, it is highly desirable to have available electrically conducting materials having a preselected room temperature electrical conductivity varying over a broad range extending from slightly conducting to highly conducting. Furthermore, particularly for use in semiconductor device applications, requiring one or more p-n junctions, such materials should advantageously be available with both p-type and n-type electrical conductivities.

It has recently been found that semiconducting acetylene polymers, such as polyacetylene, can be chemically doped in a controlled manner with electron acceptor and/or electron donor dopants to produce a whole family of p-type and n-type electrically conducting doped acetylene polymers whose room temperature electrical conductivity may be preselected over the entire range characteristic of semiconductor behavior and into the range characteristic of metallic behavior. Such doping procedures and the resulting doped acetylene polymers are described and claimed in the commonly assigned U.S. Pat. No. 4,222,903, of Alan J. Heeger, Alan G. MacDiarmid, Chwan K. Chiang, and Hideki Shirakawa, issued Sept. 16, 1980; and in the commonly assigned U.S. Pat. No. 4,204,216, of Alan J. Heeger, Alan G. MacDiarmid, Chwan K.Chiang, and Shek-Chung Gau, issued May 20, 1980; both of said patents being incorporated herein by reference. As described in said Heeger, et al. patents, a p-type material is obtained with electron acceptor dopants, and an n-type material is obtained with electron donor dopants. The resulting room temperature electrical conductivity of the doped acetylene polymer increases with increasing degree of doping up to a certain point at which the maximum conductivity is obtained for any given dopant, such maximum conductivity. generally being obtained at a degree of doping not greater than about 0.30 mol of dopant per —CH— unit of the polyacetylene.

The doping procedures described in said Heeger, et al, patents involve merely contacting the acetylene polymer with the dopant, which may be either in the vapor phase or in solution, whereby uptake of the dopant into the acetylene polymer occurs by chemical reaction and/or charge transfer to a degree proportional with both the dopant concentration and the contacting period, such concentration and contacting period being coordinated and controlled so that the corresponding degree of doping will be such as to provide the resulting doped acetylene polymer with the preselected room temperature electrical conductivity. While such doping procedures are generally effective for achieving the desired result, they are subject to certain limitations. First of all, it is rather difficult with these procedures to obtain a reliably precise control of the degree and uniformity of doping so as to ensure commercial scale production of a doped polymer product with a consistent and uniform room temperature electrical conductivity. Secondly, the fact that these procedures require a doping material which is chemically reactive with the acetylene polymer and/or capable of forming a charge transfer complex therewith is a limiting factor in the selection of suitable doping materials for optimum properties and economy. Thirdly, these procedures require the use of two totally different doping materials and, consequently, separate doping systems for carrying out p-type and n-type doping. Hence, the development of more efficient and economical doping procedures would greatly enhance the commercial attractiveness of doped acetylene polymers as substitutes for the more conventional electrically conductive materials.

Doped acetylene polymers constitute one class of recently developed molecular solids exhibiting relatively high levels of electrical conductivity. Several of these other molecular solids have previously been investigated as electrode materials in attempts at improved battery design. For example, the Moser U.S. Pat. No. 3,660,163, issued May 2, 1972, and Schneider, et al., *Proc. Int. Power Sources Conf.*, 651–659 (1974), describe the use of a charge transfer complex of iodine and poly-2-vinyl-pyridine with excess iodine as a cathode material in a solid-state lithium-iodine primary battery employing lithium iodide as a solid electrolyte. While this prior art battery is characterized by a relatively high energy density, it suffers from several drawbacks. First of all, it is a primary battery, i.e., it is not capable of being recharged. Secondly, in order to avoid the problems which might be caused by undesired flow of the viscous charge transfer complex and undesired diffusion of the excess free iodine from the cathode mixture, it is necessary for the battery to be constructed with various internal protective coatings and containment materials, which increase the weight and size of the battery and reduce its energy density and power density. Furthermore, the output current which the battery is able to deliver, both in relation to its electrode area and in relation to its weight, is rather low.

A recent article by Yoshimura, appearing in *Molecular Metals*, edited by William E. Hatfield, NATO Conference Series, Series VI: Materials Science, pp. 471–489 (1978), at pages 474–476, refers to the above-described prior art solid-state lithium-iodine primary battery constructed with poly (vinylpyridine)-iodine charge transfer complex cathode material, and broadly speculates that a number of the molecular metals, including doped polyacetylene, might possibly find similar utility as cathode materials in battery design. However, no further details are provided in regard to the possible construction or mode of operation of such hypothetical batteries. Furthermore, the possibility of doped acetylene polymers, or other doped conjugated polymers, being employed as an anode material or as one or both of the electrode materials in a secondary battery construction, i.e., in batteries which are capable of being charged and discharged over many cycles, is not even hinted at in this article.

In the aforementioned Moser U.S. Pat. No. 3,660,163, a number of other organic donor components, in addition to polyvinylpyridine, are listed as being suitable for forming the iodine charge transfer complex cathode material. The only one of these many materials listed in the patent which happens to be a conjugated polymer is polypyrrole. However, Moser attaches no particular significance to polypyrrole, either as being a conjugated polymer or as having any unique electrochemical activity properties, in either its uncomplexed or iodine-complexed form, which might set it apart from the many other organic donor components listed therein. Particularly, there is absolutely no appreciation in the Moser patent that doped polypyrrole, or any other doped conjugated polymer, could be used as one or both of the electrode materials in a secondary battery construction.

SUMMARY OF THE INVENTION

It is, accordingly, a primary object of the present invention to provide a more efficient and economical procedure for the doping of acetylene polymers and other dopable conjugated polymers to p-type and n-type materials whose room temperature electrical conductivity may be preselected within a broad range of selectivity varying from that characteristic of semiconductor behavior to that characteristic of metallic behavior.

Another object of the invention is to provide a doping procedure, in accordance with the preceding object, which enables a more precise control of the degree and uniformity of doping than the prior art procedures so as to ensure production of a doped polymer product with a consistent and uniform room temperature electrical conductivity.

Still another object of the invention is to provide a doping procedure, in accordance with the preceding objects, which enables a greater degree of versatility than the prior art procedures in the selection of suitable doping materials.

A still further object of the invention is to provide a doping procedure, in accordance with the preceding objects, which enables the same doping material to be employed either selectively or simultaneously for carrying out p-type and/or n-type doping.

Yet another object of this invention is to provide a doping procedure, in accordance with the preceding objects, which is adaptable for use in the charging or discharging of secondary batteries in which a conjugated polymer or doped conjugated polymer is employed as one or both of the electrodes.

A yet further object of the invention is to provide novel secondary batteries which are characterized by a high energy density, a high power density, a low overall weight and size, and a high output current in relation to both their electrode area and their weight.

The above and other objects are achieved in accordance with the present invention by means of electrochemical doping procedures which enable acetylene polymers and other dopable conjugated polymers to be electrochemically doped to a controlled degree with a wide selection of ionic dopant species to either a p-type or n-type material exhibiting a preselected room temperature electrical conductivity ranging from that characteristic of semiconductor behavior to that characteristic of metallic behavior. The electrochemical doping procedures of the present invention are based upon the discovery that conjugated polymers, i.e., organic polymers having conjugated unsaturation along their main backbone chain, are both electrochemically oxidizable to a p-type doped material, and electrochemically reducible to an n-type doped material, and that the degree of doping achievable by means of such electrochemical oxidation or reduction is such as to enable the initial room temperature electrical conductivity of the polymer to be increased over the same broad range achievable by the previously known chemical procedures, i.e., up into the metallic regime.

Electrochemical doping of conjugated polymers in accordance with the present invention is carried out in an electrochemical cell wherein at least one of the two electrodes thereof includes the conjugated polymer to be doped as its electrode-active material, and the electrolyte comprises a compound which is ionizable into one or more ionic dopant species. When p-type doping is desired, the polymer is used as the anode-active material of the electrochemical cell, and the dopant species is an anionic species. The p-type doping proceeds by a mechanism in which operation of the electrochemical cell effects an increase in the oxidation state of the polymer by electron transfer from the carbon atoms on the conjugatedly unsaturated polymer backbone chain, imparting a positive charge thereto and consequently attracting the dopant anions as counter ions to maintain electrical neutrality in the polymer. When n-type doping is desired, the polymer is used as the cathode-active material of the electrochemical cell and the dopant species is a cationic species. The n-type doping proceeds by a mechanism in which operation of the electrochemical cell effects a decrease in the oxidation state of the polymer by electron transfer to the carbon atoms on the conjugatedly unsaturated polymer backbone chain, imparting a negative charge thereto and consequently attracting the dopant cations as counter ions to maintain electrical neutrality in the polymer. In each case, the polymer thereby becomes doped with the ionic dopant species to a degree dependent upon the degree of change effected in the oxidation state of the polymer and the dopant species concentration in the electrolyte, which are coordinated and controlled so that the corresponding degree of doping will be such as to provide the resulting doped polymer with the preselected room temperature electrical conductivity. The charge imparted to the carbon atoms of the polymer by means of their electrochemical oxidation or reduction is highly stable, thereby enabling the polymer to form stable ionic compounds or charge transfer complexes with a wide selection of possible dopant counter ions.

In comparison with the prior art chemical procedures for preparing doped conjugated polymers, the electrochemical doping procedures of the present invention enable a more reliably precise control of the degree and uniformity of doping so as to ensure production of a doped polymer product with a consistent and uniform room temperature electrical conductivity. Furthermore, since electrochemical doping is not dependent on the chemical reactivity of the doping material with the polymer nor its ability to form charge transfer complexes therewith, it enables greater versatility in the selection of suitable doping materials for optimum properties and economy. Moreover, it is possible with electrochemical doping to selectively or simultaneously effect p-type or n-type doping employing the same electrolyte as the doping material, depending upon the type of electrochemical cell employed and whether the polymer is used as the anode-active material, the cathode-active material, or both, of the electrochemical cell.

The electrochemical doping procedures of the present invention offer the further advantage over the prior art chemical procedures of enabling the preparation of novel n-type doped conjugated polymers having a preselected room temperature electrical conductivity ranging from that characteristic of semiconductor behavior to that characteristic of metallic behavior, and wherein the dopant species is non-metallic. Such novel n-type electrically conducting polymeric materials provided by the present invention are conjugated polymers doped to a controlled degree with organic dopant cations selected from the group consisting of $R_{4-x}MH_x^+$ and $R_3E^+$, wherein R is alkyl or aryl, M is N, P or As, E is O or S and x is an integer ranging from 0 to 4.

Another aspect of the present invention is the provision of novel lightweight secondary batteries whose charging and discharging mechanisms rely upon the above-described electrochemical doping reactions together with the further discovery that such doping reactions are electrochemically reversible, i.e., that the p-type doped conjugated polymers are electrochemically reducible, and that the n-type doped conjugated polymers are electrochemically oxidizable. The electrochemical reduction of the p-type doped conjugated polymers effects an undoping of the polymer by a mechanism in which the positively charged carbon atoms along the polymer backbone chain become electrochemically reduced to an electrically neutral or less positively charged state, which results in the anionic dopant counter ions being released from the polymer. Similarly, the electrochemical oxidation of the n-type doped conjugated polymers effects an undoping of the polymer by a mechanism in which the negatively charged carbon atoms along the polymer backbone chain become electrochemically oxidized to an electrically neutral or less negatively charged state, which results in the cationic dopant counter ions being released from the polymer.

The novel secondary batteries in accordance with the present invention employ a conjugated polymer, either in dopable or doped form, as the electrode-active material of one or both of their electrodes, and utilize the various electrochemical doping and electrochemical undoping reactions described above as their charging and discharging mechanisms. The electrolyte component of such secondary batteries comprises a compound which is ionizable into one or more ionic dopant species suitable for effecting the appropriate electrochemical doping reactions, i.e., an anionic dopant species for effecting doping of an electrode-active dopable conjugated polymer to a higher oxidation state, and/or a cationic dopant species for effecting doping of an electrode-active dopable conjugated polymer to a lower oxidation state. These secondary batteries may be either initially assembled in a charged state; or initially assembled in an uncharged state, and subsequently converted in situ to such charged state by means of the above-described electrochemical doping or electrochemical undoping reactions.

The foregoing general principles provide the basis for a wide variety of novel secondary battery systems constructed in accordance with the present invention, which fall into three general classes. In the first class of such systems, the anode of the secondary battery in its charged state includes as its anode-active material a conjugated polymer doped with a cationic dopant species to an n-type electrically conducting material. The discharging mechanism of such secondary battery involves the electrochemical undoping of the anode-active cation-doped conjugated polymer, while its charging mechanism involves the reverse electrochemical doping reaction. In the second class of such systems, the cathode of the secondary battery in its charged state includes as its cathode-active material a conjugated polymer doped with an anionic dopant species to a p-type electrically conducting material The discharging mechanism of such secondary battery involves the electrochemical undoping of the cathode-active anion-doped conjugated polymer, while its charging mechanism involves the reverse electrochemical doping reaction. In the third class of such systems, the cathode of the secondary battery in its charged state includes as its cathode-active material a conjugated polymer which is cation-dopable to a lower oxidation state, the anode includes as its anode-active material a metal whose Pauling electronegativity value is no greater than 1.0, and the electrolyte comprises a compound which is ionizable into a cationic dopant species The discharging mechanism of such secondary battery involves the spontaneous electrochemical doping of the cathode-active conjugated polymer with the dopant cations to an n-type material, while its charging mechanism involves the reverse electrochemical undoping reaction.

Particularly suitable secondary battery systems in accordance with the present invention are those which are combinations and/or subclasses of the first two of the above-described three classes of systems, wherein the anode-active material and the cathode-active material of the secondary battery in its charged state are each conjugated polymers but having different oxidation states, with the oxidation state of the cathode-active conjugated polymer being higher than that of the anode-active conjugated polymer. Such secondary battery systems encompass a secondary battery which in its charged state includes (a) n-type cation-doped conjugated polymer as its anode-active material, and p-type anion-doped conjugated polymer as its cathode-active material; (b) n-type cation-doped conjugated polymer as both its anode-active and cathode-active materials, with the anode-active cation-doped conjugated polymer having a higher degree of doping than the cathode-active cation-doped conjugated polymer; (c) p-type anion-doped conjugated polymer as both its anode-active and cathode-active materials, with the cathode-active anion-doped conjugated polymer having a higher degree of doping than the anode-active anion-doped conjugated polymer; (d) n-type cation-doped conjugated polymer as its anode-active material, and undoped conjugated polymer as its cathode-active material; and (e) p-type anion-doped conjugated polymer as its cathode-active material, and undoped conjugated polymer as its anode-active material.

The novel secondary batteries in accordance with the present invention are characterized by a high energy density, a high power density, a low overall weight and size, and a high output current both in relation to their electrode area and in relation to their weight.

DESCRIPTION OF PREFERRED EMBODIMENTS

The polymer which is used as the starting material in the electrochemical doping procedures of the present invention may be any conjugated polymer which is dopable with an ionic dopant species to a more highly electrically conducting state. A number of conjugated organic polymers which are suitable for this purpose are known in the art and include, for example, acetylene polymers, poly (p-phenylene), poly (m-phenylene), poly (phenylene sulfide), $+C_6H_4CH=CH+_x$, polypyrrole, and the like. All of these polymers have conjugated unsaturation along their main backbone chain. Such conjugated polymers may be employed in the present invention in any suitable form, such as, for example, in the form of films, foams, compressed films, compacted powders, or powders dispersed in a suitable carrier matrix, e.g., another organic polymeric material. Acetylene polymers have been found to be particularly suitable starting materials.

The term "acetylene polymer", as used herein throughout the Specification and in the appended Claims, is intended to encompass polyacetylene, i.e., $(CH)_x$, as well as substituted polyacetylenes in which at least some of the hydrogen atoms on the polymer chain have been replaced by halogen, alkyl (e.g., up to about 20 carbon atoms), aryl (e.g., phenyl, halophenyl, or alkylphenyl), or combinations thereof. Such acetylene polymers may suitably be prepared for use in the present invention in the form of films, foams, compressed films, or powders, by methods known in the art. For example, the synthesis of high quality, uniformly thin, flexible polycrystalline films of polyacetylene and their characterization are described in detail in a series of papers by Shirakawa, et al., [*Polymer Journal,* Vol. 2, No. 2, pp. 231–244, (1971); *Polymer Journal,* Vol. 4, No. 4, pp. 460–462, (1973); *Journal of Polymer Science,* Part A-1, Polymer Chemistry Edition, Vol. 12, pp. 11–20, (1974); and *Journal of Polymer Science,* Part A-1, Polymer Chemistry Edition, Vol. 13, pp. 1943–1950, (1975)] all of which are incorporated herein by reference. The synthesis procedures described by Shirakawa, et al., involve polymerizing acetylene monomer in the presence of a $Ti(OC_4H_9)_4$—$Al(C_2H_5)_3$ catalyst system, employing a critical catalyst concentration to avoid the formation of polyacetylene powder to obtain, depending on the polymerization temperature, polycrystalline polyacetylene films having an all cis structure (polymerization temperatures lower than $-78°$ C.), an all trans structure (polymerization temperatures higher than $150°$ C.), or a mixed cis-trans structure (polymerization temperatures between $-78°$ C. and $150°$ C.).

The Shirakawa, et al. polymerization procedure can similarly be employed for preparing films of the abovedefined substituted polyacetylenes by using as the starting monomer a substituted acetylene monomer having the formula $RC\equiv CH$ or $RC\equiv CR'$ wherein R and R' are halogen, alkyl, or aryl. Such substituted acetylene monomers may be used either alone or in appropriate mixture with each other and/or with acetylene monomer in carrying out the polymerization reaction to obtain the desired substituted polyacetylene.

In an alternative procedure for preparing such substituted polyacetylenes, the starting material is a bromine-doped polyacetylene film prepared, for example, by the methods described in the aforementioned Heeger, et al. U.S. Pat. No. 4,222,903. When this film is heated in vacuo to a temperature within the range of from $120°$–$150°$ C. in a sealed container, HBr and $Br_2$ are first evolved. This gaseous mixture is then permitted to react further with the film at room temperature and is then reheated to within the aforementioned temperature range. After this procedure has been repeated several times, all the $Br_2$ is absorbed and HBr is the only gaseous material formed. The resulting product is a substituted polyacetylene in which some of the hydrogen atoms on the polymer chain have been replaced by bromine atoms. Subsequent treatment of this substituted polyacetylene with alkyl or aryl organometallic reagents, e.g., methyl lithium, phenylmagnesium bromide, or Friedel-Craft-type reagents, will lead to replacement of the bromine atoms by the organic group in the organometallic reagent employed. In the substituted polyacetylenes prepared in this manner, some of the CH bonds in the original polyacetylene polymer may be converted to C—C or $C\equiv C$.

While the acetylene polymers employed in carrying out the present invention are preferably in the form of films, prepared as described above, they may also suitably be in the form of compacted or matrix-dispersed powders prepared, for example, as described by Berets, et al. *Trans. Faraday Soc.,* Vol. 64, pp. 823–828, (1968), incorporated herein by reference; or in the form of foams or compressed films prepared from intermediate gels, as described by Wnek, et al., *Polymer Preprints,* Vol. 20, No. 2, pp. 447–451, September, 1979, also incorporated herein by reference.

In accordance with the electrochemical doping procedures of the present invention, p-type doping of the conjugated polymer is effected with anionic dopant species, while n-type doping of the polymer is effected with cationic dopant species. A wide variety of anionic and cationic dopant species may suitably be employed, either individually or in combination, for effectively modifying the room temperature electrical conductivity of the conjugated polymer in accordance with the present invention.

Suitable anionic dopant species for effecting p-type doping include, for example, $I^-$, $Br^-$, $Cl^-$, $F^-$, $ClO_4^-$, $PF_6^-$, $AsF_5^{31}$, $AsF_4^-$, $SO_3CF_3^-$, $BF_4^-$, $BCl_4^-$, $NO_3^-$, $POF_4^-$, $CN^-$, $AsF_6^-$, $SiF_5^-$, $CH_3CO_2^-$ (acetate), $C_6H_5CO_2^-$ (benzoate), $CH_3C_6H_4SO_3^-$ (tosylate), $SiF_6^{--}$, $SO_4^{--}$, or the like.

One class of cationic dopant species particularly suitable for effecting n-type doping are metallic cations of a metal whose Pauling electronegativity value is no greater than 1.6. A complete list of such metals and their corresponding electronegativity values are provided in Table I below.

TABLE I

| Metal | Electronegativity Value |
|---|---|
| Cs | 0.7 |
| Rb | 0.8 |
| K | 0.8 |
| Na | 0.9 |
| Ba | 0.9 |
| Li | 1.0 |
| Sr | 1.0 |
| Ca | 1.0 |
| Mg | 1.2 |
| Y | 1.3 |
| Sc | 1.3 |
| Be | 1.5 |
| Al | 1.5 |
| Zr | 1.6 |
| Ti | 1.6 |

The above list of metals includes all of the alkali metals, all of the alkaline earth metals, and certain of the metals from Group 3 (Y, Sc and Al) and Group 4 (Zr and Ti) of the Periodic Table.

Another class of cationic dopant species particularly suitable for effecting n-type doping are organic cations selected from the group consisting of $R_{4-x}MH_x^{30}$ and $R_3E^+$, wherein R is alkyl (e.g., up to about 20 carbon atoms), aryl (e.g., phenyl, halophenyl, or alkylphenyl), or combinations thereof; M is N, P or As; E is O or S;

and x is an integer ranging from 0 to 4. In such organic cations having more than one R group, the various R groups may be the same or different. Such organic cations which are particularly suitable are those wherein R is a $C_1$ to $C_{10}$ alkyl group, and x is O, i.e., tetraalkyl ammonium, tetraalkyl phosphonium, tetraalkyl arsonium, trialkyl oxonium, and trialkyl sulfonium cations.

Each of the anionic and cationic dopant species set forth above will effect an increase, to varying degrees, in the room temperature electrical conductivity of the starting conjugated polymer. For the widest range in selectivity as to achievable conductivities, the preferred cationic dopant species are tetraalkyl ammonium and alkali metal cations, particularly $Li^+$; and the preferred anionic dopant species are halide ions, $ClO_4^-$, $PF_6^-$, $AsF_6^-$, $AsF_4^-$, $SO_3CF_3^-$, and $BF_4^-$.

A compound which is ionizable into one or more of the above-described ionic dopant species is employed as the active material of the electrolyte of the electrochemical cell in carrying out the electrochemical doping procedures in accordance with the present invention, and thereby serves as the dopant ion source. Such ionizable compound may suitably be a simple salt of one of the cationic species of dopant ions with one of the anionic species of dopant ions, in which case the electrolyte has the versatility of being usable for selectively or simultaneously effecting p-type or n-type doping, depending upon the type of electrochemical cell employed and whether the conjugated polymer is used as the anode-active material, the cathode-active material, or both, of the electrochemical cell. Halide, perchlorate, or hexafluorophosphate salts of either an alkali metal or a tetraalkyl ammonium cation are particularly useful examples of this type of ionizable compound. Other types of ionizable compounds, which are ionizable into only one species of dopant ions, are also suitable for use in carrying out the electrochemical doping procedures in accordance with the present invention, in those instances wherein only one type of doping, i.e., either p-type or n-type, is desired.

The ionizable compound, which is used as the active electrolyte material of the electrochemical cell in carrying out the electrochemical doping procedures in accordance with the present invention, may suitably be employed in the form of a solid, fused solid (i.e., molten salt, e.g., $Na_{0.5}K_{0.5}[AlCl_4]$, or dissolved in a suitable solvent for the ionizable compound which is inert with respect to the electrode materials and which will permit the migration of the dopant ions to the electrode-active materials. Alkali metal halides, such as lithium iodide, are particularly suitable for use as solid electrolytes. Suitable solvents for use in preparing electrolyte solutions include water, methylene chloride, acetonitrile, alcohols (e.g., ethyl alcohol), ethers (e.g., monoglyme, diglyme, or solid polyethylene oxide), cyclic ethers (e.g., tetrahydrofuran or dioxane), hexamethylphosphoramide, propylene carbonate, methyl acetate, dioxolane, or the like. When using an electrolyte solution for carrying out n-type doping with $Li^+$, $Na^+$, or $K^+$, it is generally preferred to employ ethers or cyclic ethers as the solvent due to the high reactivity of the resulting doped material with many of the other solvents. The concentration of the ionizable compound when employed in the form of an electrolyte solution may suitably be within the range of from about 0.01 to about 2.0 molar. The solutions of lower molarity are preferably employed when the doped polymer being prepared is to have a relatively low room temperature electrical conductivity, while the solutions of higher molarity are preferably employed when such doped polymer is to have a relatively high conductivity.

Depending upon whether p-type or n-type doping is to be effected, the electrochemical cell employed for carrying out the electrochemical doping procedures of the present invention may be either an electrolytic cell (i.e., wherein the anode and cathode are electrically connected to the positive and negative terminals, respectively, of an external dc power source), or a voltaic cell (i.e., wherein the external circuit electrically connecting the anode and cathode does not include any external power source). Either p-type or n-type electrochemical doping may suitably be carried out in an electrolytic cell, while n-type electrochemical doping may alternatively be carried out in a voltaic cell.

For carrying out the electrochemical doping procedures in accordance with the present invention in an electrolytic cell, the conjugated polymer to be doped is employed as the electrode-active material of one or both of the electrodes, depending upon the type of doping desired. If only p-type doping is to be effected, the polymer will be used as the anode-active material, and a suitable electrolyte will be chosen so as to comprise a compound which is ionizable at least into an anionic dopant species. If only n-type doping is to be effected, the polymer will be used as the cathode-active material, and a suitable electrolyte will be chosen so as to comprise a compound which is ionizable at least into a cationic dopant species. In each of these two cases, the other electrode may suitably comprise any metal which is inert to the electrolyte employed, such as, for example, platinum, palladium, ruthenium, rhodium, gold, iridium, aluminum, or the like. If it is desired to effect both p-type and n-type doping simultaneously in the same electrolytic cell, a conjugated polymer can be employed both as the anode-active material and as the cathode-active material of the cell, and a suitable electrolyte chosen so as to comprise a compound which is ionizable into both an anionic dopant species and a cationic dopant species.

The electrical energy source for powering the electrolytic cell in carrying out the electrochemical doping procedures in accordance with the present invention, may suitably be any dc power supply, such as, for example, a battery, which is capable of delivering an electrical potential sufficiently high to initiate electrochemical oxidation and/or reduction of the conjugated polymer, or electron transfer from and/or to the polymer, but sufficiently low so as not to produce electrochemical degradation of the polymer or of the solvent. Such electrical potential may suitably be, for example, within the range of from about 2 to 25 volts, with about 9 volts being found to be particularly suitable.

For producing a doped conjugated polymer exhibiting a preselected p-type or n-type room temperature electrical conductivity by means of the electrochemical doping procedures of the present invention, the electrolytic cell is first assembed in the appropriate manner for obtaining the desired type of doping as described above, i.e., with the polymer or polymers at the appropriate electrode position and with the appropriate electrolyte and dc power supply. The cell is then operated by applying an electrical potential thereto sufficient to effect a change in the oxidation state of the polymer. Doping of the polymer with the dopant ions consequently occurs by migration of the anionic dopant ions into the anode-active polymer to produce a p-type material and/or by migration of the cationic dopant ions into the cathode-active polymer to produce an n-type material, by means of the doping mechanisms described more fully above. The degree of such doping will be dependent upon the degree of change effected in the oxidation state of the polymer (which will be a function of the voltage and time period of the applied potential) and the dopant ion concentration in the electrolyte, all of which variables are properly coordinated and controlled so that the corresponding degree of doping will be such as to provide the resulting doped polymer or polymers with the preselected room temperature electrical conductivity. In general, the required degree of doping can suitably be obtained with applied potentials ranging from about 2 to 25 volts for a time period ranging from about a few minutes to about a few hours and with dopant ion concentrations equivalent to an electrolyte solution having an ionizable compound concentration within the range of from about 0.01 to about 2.0 molar. Within these broad operating ranges, the proper combination of the voltage and time period of the applied potential and the dopant ion concentration in the electrolyte to obtain the desired degree of doping can generally be predetermined by trial and error procedures. For example, employing as the electrolyte a 0.5 molar solution of either potassium iodide or tetra-n-butyl ammonium perchlorate, and an applied potential of about 9 volts, polyacetylene can be electrochemically doped with $I_3^-$ or $ClO_4^-$, respectively, to a highly conductive metallic state in a time period ranging from about 0.5 to about 1.0 hour.

For carrying out n-type electrochemical doping in accordance with the present invention in a voltaic cell, the conjugated polymer to be doped is employed as the cathode-active material, and the anode-active material is a metal whose Pauling electronegativity value is no greater than 1.0. As indicated by the values listed in Table 1, above, the anode-active metals contemplated for use in this embodiment thus include all of the alkali metals, Ba, Ca and Sr. All of these metals have standard oxidation electrode potentials greater than 2.70. The preferred anode-active metal is lithium, which has the highest standard oxidation electrode potential. The electrolyte comprises a compound which is ionizable at least into a cationic dopant species. If the dopant cations are of a different species than the anode-active metal, a suitable separator means, e.g , a glass frit, is preferably employed for preventing mixing of the dopant cations with the metallic cations released from the anode as a result of the anode reaction during cell discharge.

The voltaic cell is operated by discharging it through the external circuit electrically connecting the anode and cathode so as to effect a reduction in the oxidation state of the polymer by electron transfer thereto from the anode-active metal. Doping of the polymer with the dopant cations to an n-type material consequently spontaneously occurs by means of the n-type doping mechanism described more fully above. The degree of such doping will be dependent upon the degree of reduction effected in the oxidation state of the polymer (which will be a function of the time period of the cell discharge and the standard oxidation electrode potential of the anode-active metal) and the dopant ion concentration in the electrolyte, all of which variables are properly coordinated and controlled so that the corresponding degree of doping will be such as to provide the resulting doped polymer with the preselected room temperature electrical conductivity. Similarly as with the electrolytic cell embodiment described above, and within similar broad operating ranges of time periods and concentrations, the proper combination of the time period of the cell discharge, the standard oxidation electrode potential of the anode-active metal, and the dopant ion concentration in the electrolyte, to obtain the desired degree of doping, can generally be predetermined by trial and error procedures. For example, employing lithium as the anode-active metal, and a 0.3 molar solution of lithium perchlorate in tetrahydrofuran as the electrolyte of the voltaic cell, polyacetylene can be electrochemically doped with $Li^+$ to a highly conductive metallic state in a time period ranging from about 0.5 to about 1.0 hour.

Simplification of the coordination and control of the operating condition variables of the electrochemical doping procedures so as to enable precise achievement of the desired degree of doping, is made possible by the fact that the progressive conversion of the conjugated polymer to a more highly conductive state with increasing degree of doping is accompanied by a correspondingly progressive change in the current flow through the electrochemical cell. Thus, once the correlation between such current flow and the degree of doping has been established for any given electrochemical doping system, monitoring of such current flow, for example, by means of an ammeter connected into the external circuitry of the electrochemical cell, provides a direct monitoring of the degree of doping in that system. Furthermore, provided that the electrolyte employed is one which is normally chemically unreactive with the polymer so that the doping reaction is entirely electrochemical in nature, such reaction is terminable with a sharp cutoff point precluding any over-doping of the polymer, merely by switching off the operation of the electrochemical cell. These two features combine to provide the electrochemical doping procedures of the present invention with a reliably precise control of the degree and uniformity of doping so as to ensure production of a doped polymer product with a consistent and uniform room temperature electrical conductivity.

The maximum degree of doping and the corresponding maximum level of room temperature electrical conductivity of the resulting doped polymer, which are achievable by means of the electrochemical doping procedures of the present invention, will vary with the particular type and form of conjugated polymer and the particular species of dopant ions employed. Up to such maximum level, the resulting conductivity will increase with increasing degrees of doping. With acetylene polymers, for example, a degree of doping ranging from less than about 0.001 to about 0.1 mol of dopant ion per carbon atom of the acetylene polymer main chain will increase the room temperature electrical conductivity of the starting acetylene polymer to a value ranging from slightly in excess of that of the undoped acetylene polymer up to on the order of $10^3$ ohm$^{-1}$ cm$^{-1}$. Since the conductivity of the undoped acetylene polymer will typically be on the order of about $10^{-9}$ to $10^{-5}$ ohm$^{-1}$ cm$^{-1}$ depending upon its composition and method of preparation, and since the semiconductor-metal transition of the doped polymer will generally be reached at a conductivity of approximately 1 ohm$^{-1}$ cm$^{-1}$, the electrochemical doping procedures of the present invention provide a broad range of selectivity in the resulting room temperature electrical conductivity of the doped polymer, extending over the entire semiconductor regime and into the metallic regime.

As described more fully above, the electrochemical doping procedures of the present invention proceed by mechanisms which impart a positive or negative charge to the carbon atoms on the conjugatedly unsaturated polymer backbone chain, which charge attracts the dopant anions or cations as counter ions to maintain electrical neutralitY in the polymer. Due to the presence of the conjugated unsaturation along the main backbone chain of the polymer, making a large number of resonance forms available, the charge imparted to the carbon atoms becomes delocalized along the carbon atom chain over a very large number of carbon atoms. Such delocalization of the charge renders the charge highly stable, thereby enabling the polymer to form stable ionic compounds or charge transfer complexes with a wide selection of possible dopant counter ions, which selection is substantially broader in scope than that permitted with the prior art chemical doping procedures.

The broader selection of suitable dopant species made possible by the electrochemical doping procedures of the present invention, enables the preparation of novel n-type doped conjugated polymers of varying levels of room temperature electrical conductivity ranging up into the metallic regime, and wherein the cationic dopant species is non-metallic in nature. Such novel n-type electrically conducting polymeric materials provided by the present invention are conjugated polymers doped to a controlled degree with organic dopant cations selected from the group consisting of $R_{4-x}MH_x^+$ and $R_3E^+$, wherein R is alkyl or aryl, M is N, P or As, E is O or S, and x is an integer ranging from 0 to 4. These organic dopant cations are more fully described above. The molecular size of these organic dopant cations and their solubility properties in various organic solvents may be varied over a rather broad range merely by varying the size and number of their R groups. Since the molecular size of the dopant species may be an important factor in determining the electrical conductivity and various other properties imparted to the doped polymer, the novel organic cation-doped n-type conjugated polymers provided by the present invention offer a wider range of flexibility in this regard than the metallic cation-doped n-type conjugated polymers previously described.

The electrochemical doping procedures of the present invention may thus suitably be employed as an efficient and economical means for the production of various p-type or n-type doped polymer stock materials of varying levels of room temperature electrical conductivity for use in a wide variety of electrical and electronic device applications.

The electrochemical doping reactions of the present invention, and their reverse electrochemical undoping reactions described in detail above, find particularly useful application in the design of novel lightweight secondary batteries in accordance with the present invention. Such secondary batteries employ a conjugated polymer, either in dopable or doped form, as the electrode-active material of one or both of their electrodes, and utilize the various electrochemical doping and/or electrochemical undoping reactions described above as their charging and/or discharging mechanisms. These secondary batteries may be either initially assembled in a charged state; or initially assembled in an uncharged state, and subsequently converted in situ to such charged state by means of the electrochemical doping reactions (if the charged state of the battery employs the polymer in doped form) or by means of the electrochemical undoping reactions (if the charged state of the battery employs the polymer in dopable form). Depending upon the type of battery system being assembled, pre-doped polymer may be either optional or required in the initial assembly.

Regardless of whether they are used as the charging mechanism or as the discharging mechanism of any specific secondary battery system in accordance with the present invention, the electrochemical doping reactions involve the doping of an electrode-active dopable conjugated polymer to a higher oxidation state with an anionic dopant species and/or to a lower oxidation state with a cationic dopant species. Conversely, regardless of whether they are used as the charging mechanism or as the discharging mechanism of any specific secondary battery system in accordance with the present invention, the electrochemical undoping reactions involve the undoping of an electrode-active anion-doped conjugated polymer to a lower oxidation state and/or an electrode-active cation-doped conjugated polymer to a higher oxidation state.

In each of the various types of secondary battery systems in accordance with the present invention, either the charging mechanism or the discharging mechanism involves one or both of the above-described electrochemical doping reactions, and the reverse mechanism involves the corresponding reverse electrochemical undoping reactions. The electrolyte component in each of these systems comprises a compound which is ionizable into one or more ionic dopant species for effecting the appropriate electrochemical doping reactions, i.e., an anionic dopant species for effecting doping of an electrode-active dopable conjugated polymer to a higher oxidation state, and/or a cationic dopant species for effecting doping of an electrode-active dopable conjugated polymer to a lower oxidation state. The conjugated polymers, anionic dopant species, and cationic dopant species suitable and preferable for use in battery construction in accordance with the present invention, are all the same as those described above in connection with the electrochemical doping procedures.

The various types of secondary battery systems in accordance with the present invention may be divided into three general classes. In the first class of such systems, the anode of the secondary battery in its charged state includes as its anode-active material a conjugated polymer doped with a cationic dopant species to an n-type electrically conducting material. This class includes a wide variety of battery systems wherein such anode is employed in combination with various compatible electrolytes and cathodes. The discharging mechanism of such secondary battery involves the electrochemical undoping of the cation-doped conjugated polymer anode to a higher oxidation state, the cationic dopant species being retrievably released from the polymer into the electrolyte system. In the uncharged or discharged state of such secondary battery, its anode-active material is the conjugated polymer in undoped form and/or in a form which is cation-dopable to a lower oxidation state. The charging mechanism of such secondary battery involves the electrochemical doping of such cation-dopable conjugated polymer to a lower oxidation state with the cationic dopant species from the electrolyte system.

In the second class of secondary battery systems in accordance with the present invention, the cathode of the secondary battery in its charged state includes as its cathode-active material a conjugated polymer doped with an anionic dopant species to a p-type electrically conducting material. This class includes a wide variety of battery systems wherein such cathode is employed in combination with various compatible electrolytes and anodes. The discharging mechanism of such secondary battery involves the electrochemical undoping of the anion-doped conjugated polymer cathode to a lower oxidation state, the anionic dopant species being retrievably released from the polymer into the electrolyte system. In the uncharged or discharged state of such secondary battery, its cathode-active material is the conjugated polymer in undoped form and/or in a form which is anion-dopable to a higher oxidation state. The charging mechanism of such secondary battery involves the electrochemical doping of such anion-dopable conjugated polymer to a higher oxidation state with the anionic dopant species from the electrolyte system.

One particularly suitable type of secondary battery system of this second class employs the p-type anion-doped conjugated polymer as its cathode-active material in combination with an anode including as its anode-active material a metal whose Pauling electronegativity value is no greater than 1.6. Such anode-active metal is preferably an alkali metal, particularly lithium. Typical secondary battery systems of this type include an alkali metal as the anode-active material; a p-type halide-, perchlorate-, or hexafluorophosphate-doped conjugated polymer as the cathode-active material; and a halide, perchlorate, or hexafluorophosphate salt of either an alkali metal or a tetraalkyl ammonium cation as the electrolyte-active material, with the alkali metal of both the anode-active material and the electrolyte salt preferably being lithium.

Other particularly suitable types of secondary battery systems in accordance with the present invention are those which are combinations and/or subclasses of the above-described first and second classes of systems, wherein the anode-active material and the cathode-active material of the secondary battery in its charged state are each conjugated polymers but having different oxidation states, with the oxidation state of the cathode-active conjugated polymer being higher than that of the anode-active conjugated polymer. There are five different types of secondary battery systems which fall into this category:

(a) A secondary battery which in its charged state includes n-type cation-doped conjugated polymer as its anode-active material, and p-type anion-doped conjugated polymer as its cathode-active material. The discharging mechanism of such secondary battery involves the simultaneous electrochemical undoping of the cation-doped conjugated polymer to a higher oxidation state and of the anion-doped conjugated polymer to a lower oxidation state, the cationic and anionic dopant species being retrievably released from their respective host polymers into the electrolyte system. In the uncharged or fully discharged state of such secondary battery, the two electrode-active conjugated polymers are each in substantially undoped form, and hence in substantially the same oxidation state. The charging mechanism of such secondary battery involves the simultaneous electrochemical doping of one of its electrode-active conjugated polymers (i.e., the anode-active polymer of the charged battery) to a lower oxidation state with the cationic dopant species from the electrolyte system, and of the other electrode-active conjugated polymer (i.e., the cathode-active polymer of the charged battery) to a higher oxidation state with the anionic dopant species from the electrolyte system.

(b) A secondary battery which in its charged state includes n-type cation-doped conjugated polymer as both its anode-active and cathode-active materials, with the anode-active cation-doped conjugated polymer having a higher degree of doping than the cathode-active cation-doped conjugated polymer. The discharging mechanism of such secondary battery involves the electrochemical undoping of the anode-active cation-doped conjugated polymer to a higher oxidation state, the cationic dopant species being retrievably released from the polymer into the electrolyte system; and the simultaneous electrochemical doping of the cathode-active cation-doped conjugated polymer to a lower oxidation state with the cationic dopant species from the electrolyte system. In the uncharged or fully discharged state of such secondary battery, the two electrode-active conjugated polymers are each cation-doped to substantially the same degree, and hence in substantially the same oxidation state. The charging mechanism of such secondary battery involves the electrochemical doping of one of its electrode-active cation-doped conjugated polymers (i.e., the anode-active polymer of the charged battery) to a lower oxidation state with the cationic dopant species from the electrolyte system; and the simultaneous electrochemical undoping of the other electrode-active cation-doped conjugated polymer (i.e., the cathode-active polymer of the charged battery) to a higher oxidation state, the cationic dopant species being retrievably released from the polymer into the electrolyte system.

(c) A secondary battery which in its charged state includes p-type anion-doped conjugated polymer as both its anode-active and cathode-active materials, with the cathode-active anion-doped conjugated polymer having a higher degree of doping than the anode-active anion-doped conjugated polymer. The discharging mechanism of such secondary battery involves the electrochemical undoping of the cathode-active anion-doped conjugated polymer to a lower oxidation state, the anionic dopant species being retrievably released from the polymer into the electrolyte system; and the simultaneous electrochemical doping of the anode-active anion-doped conjugated polymer to a higher oxidation state with the anionic dopant species from the electrolyte system. In the uncharged or fully discharged state of such secondary battery, the two electrode-active conjugated polymers are each anion-doped to substantially the same degree, and hence in substantially the same oxidation state. The charging mechanism of such secondary battery involves the electrochemical doping of one of its electrode-active anion-doped conjugated polymers (i.e., the cathode-active polymer of the charged battery) to a higher oxidation state with the anionic dopant species from the electrolyte system; and the simultaneous electrochemical undoping of the other electrode-active anion-doped conjugated polymer (i.e., the anode-active polymer of the charged battery) to a lower oxidation state, the anionic dopant species being retrievably released from the polymer into the electrolyte system.

(d) A secondary battery which in its charged state includes n-type cation-doped conjugated polymer as its anode-active material, and undoped conjugated polymer as its cathode-active material. This type of secondary battery is identical with the type (b) secondary battery system in its discharging and charging mechanisms and in its configuration in the uncharged or fully discharged state.

(e) A secondary battery which in its charged state includes p-type anion-doped conjugated polymer as its cathode-active material, and undoped conjugated polymer as its anode-active material. This type of secondary battery is identical with the type (c) secondary battery system in its discharging and charging mechanisms and in its configuration in the uncharged or fully discharged state.

Typical secondary battery systems of the above-described types (a) to (e) include a halide, perchlorate, or hexafluorophosphate salt of either an alkali metal or a tetraalkyl ammonium cation as the electrolyte-active material; an alkali metal cation- or tetraalkyl ammonium cation-doped conjugated polymer as the electrode-active n-type polymer (in the type (a), (b) and (d) systems); and a halide-, perchlorate-, or hexafluorophosphate-doped conjugated polymer as the electrode-active p-type polymer (in the type (a), (c) and (e) systems). The preferred alkali metal salts and cations in these systems are lithium salts and cations.

It should be noted that a polypyrrole-iodine charge transfer complex, which is taught in the aforementioned Moser U.S. Pat. No. 3,660,163, as a cathode material in combination with a lithium anode in a primary battery system, is a halide-doped conjugated polymer, and hence suitable as a cathode-active material in the above-described second class of secondary battery systems in accordance with the present invention. However, it is contemplated that the use of a polypyrrole-iodine charge transfer complex as a cathode-active material in such second class of secondary battery systems will be limited in accordance with the present invention to only those systems wherein the anode-active material is a conjugated polymer in a lower oxidation state than the cathode-active anion-doped conjugated polymer, i.e., the above-described type (a), (c) and (e) systems.

In the third class of secondary battery systems in accordance with the present invention, the cathode of the secondary battery in its charged state includes as its cathode-active material a conjugated polymer in undoped form and/or in a form which is cation-dopable to a lower oxidation state, the anode includes as its anode-active material a metal whose Pauling electronegativity value is no greater than 1.0, and the electrolyte comprises a compound which is ionizable into a cationic dopant species. As indicated by the values listed in Table I, above, the anode-active metals contemplated for use in this class of secondary battery systems thus include all of the alkali metals, Ba, Ca and Sr. All of these metals have standard oxidation electrode potentials greater than 2.70. The discharging mechanism of such secondary battery involves the spontaneous electrochemical doping of the cathode-active conjugated polymer to a lower oxidation state with the cationic dopant species from the electrolyte system. In the uncharged or discharged state of such secondary battery, its cathode-active material is the conjugated polymer doped with the cationic dopant species to an n-type material. The charging mechanism of such secondary battery involves the electrochemical undoping of the cation-doped conjugated polymer to a higher oxidation state, the cationic dopant species being retrievably released from the polymer into the electrolyte system.

Typical secondary battery systems of this third class include an alkali metal as the anode-active material; an undoped conjugated polymer as the cathode-active material; and a halide, perchlorate, or hexafluorophosphate salt of either an alkali metal or a tetraalkyl ammonium cation as the electrolyte-active material, with the alkali metal of both the anode-active material and the electrolyte salt preferably being lithium.

In regard to each of the various systems of secondary batteries in accordance with the present invention, initial assembly of the battery may conveniently be in one or the other of the above-described charged and uncharged states of the particular system being assembled, employing, as the case may be, either undoped conjugated polymers or conjugated polymers which have been pre-doped to the required degree (i.e., generally into the metallic regime) with the appropriate ionic dopant species. Such pre-doped polymers may be prepared either by the electrochemical doping procedures of the present invention, or by the prior art chemical doping techniques described in the aforementioned Heeger, et al. U.S. Pat. Nos. 4,222,903 and 4,204,216. Appropriately pre-doped polymers are required in the initial assembly of the above-described type (b), (c), (d), and (e) systems, regardless of whether such initial assembly is in the charged or uncharged state of the battery. In all of the other above-described systems, the use of pre-doped polymer in the initial assembly is optional.

In assembling the secondary batteries in accordance with the present invention, each electrode may, if desired, include a suitable current collector for supporting the electrode-active material and providing electrical connection thereto, according to techniques well-understood in the art. Such current collector, if employed, may suitably be formed of any highly electrically conductive material which is chemically stable toward the electrode-active material, such as, for example, gold, platinum, tantalum, carbon, aluminum, stainless steel, or the like. However, due to their high room temperature electrical conductivities in the metallic regime when doped to a sufficiently high degree, the doped or dopable conjugated polymers may suitably be employed alone as the entire anode and/or cathode of the battery, without the need for any additional highly conductive material, either in admixture therewith or as a separate current collector, and without any substantial sacrifice in the capability of the battery of delivering a high output current. This feature is highly significant, since it enables a substantial savings in the total battery weight required for achieving a relatively high output current, thereby providing the battery with a relatively high output current per unit weight, high power density and high energy density.

For optimum capability of the battery to deliver a relatively high output current, the electrode-active conjugated polymers, at least when they are in their form of highest degree of doping in the particular battery system employed, should have a degree of doping sufficient to provide the polymers with room temperature electrical conductivities in the metallic regime, i.e., at least about 1 ohm$^{-1}$ cm$^{-1}$. The exact degree of doping sufficient to meet this requirement will vary with the particular type and form of conjugated polymer and the particular ionic dopant species employed. With acetylene polymers, for example, such degree of doping typically will be in the range of from about 0.01 to about 0.1 mol of dopant ion per carbon atom of the acetylene polymer main chain, i.e., a degree of doping ranging from about 1 to about 10 mol percent.

The ionizable compound of the electrolyte will, as a general rule, be a simple salt of the ionic dopant species required for effecting the appropriate electrochemical doping reactions involved in the charging and/or discharging of the battery system. The electrolyte salt may be used in the form of a solid electrolyte, e.g., in finely divided form, but is preferably employed in the form of an electrolyte solution or suspension in a suitable solvent which is inert with respect to the electrode materials and which will permit the migration of the electrolyte ions to and from the electrode-active materials (for example, propylene carbonate; an ether, such as monoglyme, diglyme, or solid polyethylene oxide; or a cyclic ether, such as tetrahydrofuran or dioxane). Since the electrolyte preferably includes only a minimal amount of solvent sufficient for moistening the electrolyte salt to facilitate ionic mobility, a particularly suitable form of the electrolyte is a suspension of the electrolyte salt in its saturated solution, e.g., a paste.

The electrolyte is preferably impregnated within a solid matrix in the internal circuit of the battery structure. Such solid matrix may comprise one or both of the electrode-active conjugated polymers and/or an inert porous medium permeable to the electrolyte and separating the two electrode-active materials, such as, for example, filter paper, glass frit, porous ceramic, the conjugated polymer in undoped form, or the like. When impregnated within the electrode-active conjugated polymer, the electrolyte further serves as an ionic conductor which fills the voids in whole or in part between particles or fibers of the polymeric material. The impregnation may be effected by wetting the matrix material with a concentrated, e.g., saturated, solution or suspension of the electrolyte salt in a suitable inert solvent, as described above. While the solvent may subsequently be volatilized, for example, under vacuum, to leave the electrolyte salt impregnated within the matrix as a solid electrolyte, it has been found preferable to maintain a minimal amount of solvent present in the impregnated matrix sufficient for moistening the electrolyte salt in order to facilitate ionic mobility. The electrolyte salt should preferably be present in the internal circuit of the battery structure in an amount in excess of that required for effecting the appropriate electrochemical doping reactions involved in charging and/or discharging of the battery system.

In those types of battery systems in accordance with the present invention wherein a doped or dopable conjugated polymer is employed as each of the electrode-active materials (i.e., the above-described type (a) to (e) battery systems), the anode-active material and the cathode-active material may be two separate masses of conjugated polymer, or alternatively, may be opposite surfaces of the same unitary mass of conjugated polymer, with the electrolyte suitably impregnated within the conjugated polymer. In the latter embodiment, when the secondary battery is in its uncharged or fully discharged state, the opposite surfaces of the conjugated polymer mass will be in substantially the same oxidation state, i.e., in substantially undoped form (the type (a) system), cation-doped to substantially the same degree (the type (b) and (d) systems), or anion-doped to substantially the same degree (the type (c) and (e) systems). When the secondary battery is in its charged state, on the other hand, the anode-active material and the cathode-active material will be formed, respectively, as the two opposite surface layers of a three-layered unitary mass of conjugated polymer whose cathode-active surface layer is in a higher oxidation state than its anode-active surface layer, and whose central layer constitutes the conjugated polymer impregnated with the electrolyte and in an oxidation state intermediate between those of the anode-active and cathode-active surface layers.

In certain of the secondary battery systems in accordance with the present invention, i.e., in the above-described type (a) system, and in the system of the above-described second class employing an anode-active metal whose Pauling electronegativity value is no greater than 1.6, their operational discharge involves the internal liberation of dopant cations or cations of the metal from the anode-active material and dopant anions from the cathode-active material, resulting in the in situ formation of additional amounts of the electrolyte salt as the cell discharge reaction product. While it is possible to rely solely upon such in situ-formed electrolyte salt as the electrolyte of the battery, it has been found that the performance characteristics of the battery (e.g., the energy density) are enhanced when the battery in its charged state is initially primed with electrolyte in excess of that formed in situ, for example, by the impregnation techniques described above.

In all of the various secondary battery systems in accordance with the present invention, charging from an initially assembled uncharged state of the battery, and recharging after operational discharge of the battery, are accomplished by electrically connecting the anode and cathode of the secondary battery to the negative and positive terminals, respectively, of a suitable dc power supply, such as, for example, a 9-volt battery, so as to form an electrolytic cell. In accordance with conventionally accepted nomenclature, the anode-active material of the secondary battery becomes the cathode-active material of the electrolytic cell, and correspondingly, the cathode-active material of the secondary battery becomes the anode-active material of the electrolytic cell. When an electrical potential is applied to the electrolytic cell sufficient to effect a change in the oxidation state of the electrode-active conjugated polymer or polymers, the secondary battery is converted from its uncharged or discharged state to its charged state by the various electrochemical doping and/or undoping reactions described above. Upon completion of the charging operation, the resulting charged secondary battery is disconnected from the dc power supply, and is then ready for use. The secondary batteries of the present invention are in this manner capable of being discharged and recharged over many cycles.

The extremely light weight and high conductivity of doped conjugated polymers, particularly when employed in the form of films ranging in thickness, for example, of from 10 to 100 microns, enable the construction of novel secondary batteries in accordance with the present invention which are characterized by a high energy density, a high power density, a low overall weight and size, and a high output current both in relation to their electrode area and in relation to their weight. For example, preliminary tests have indicated that a secondary battery construction in accordance with the present invention is capable of exhibiting an initial power density, of approximately 4 kw/lb, based on the combined weight of the anode and cathode. In comparison, a normal flashlight battery exhibits an initial power density of about 2 w/lb. The secondary batteries of the present invention are thus capable of delivering an exceptionally large surge of power per unit weight over a short interval of time, and hence have potential utility as lightweight automotive batteries.

It will be understood that while the batteries of the present invention have been described principally in terms of their use as secondary batteries, i.e., having the capability of operating both in the discharge mode and in the charge mode so as to permit multiple reuse, they may, if desired, also be employed as primary batteries operating in the discharge mode alone.

The invention is further illustrated by way of the following examples.

Example 1

A 1 cm×3 cm×0.01 cm strip of polyacetylene film composed of approximately 82% cis-isomer and having a room temperature electrical conductivity of about $1\times10^{-8}$ ohm$^{-1}$ cm$^{-1}$, was employed as the anode of an electrolytic cell having a platinum cathode and an aqueous 0.5 M potassium iodide electrolyte solution. The electrolytic cell was powered by a 9-volt battery, and an ammeter was connected into the external circuit of the cell. Electrolysis of the electrolyte was carried out by applying to the cell an electrical potential of 9 volts for a period of 0.5 hour, during which time the current as measured by the ammeter increased from 1 to 43 mA. The anode film was then removed from the cell, and its composition was determined by elemental analysis to be $(CHI_{0.07})_x$. It is important to note that the iodide-doped polyacetylene film contained no oxygen (total C, H, and I content equalled 99.8%) and hence had undergone no hydrolysis and/or chemical oxidation during the electrolytic doping process.

The room temperature electrical conductivity of the p-type iodide-doped polyacetylene film was measured using four-probe DC techniques, and was found to be 9.7 ohm$^{-1}$ cm$^{-1}$. This value is consistent with that previously observed for polyacetylene films doped with iodine to the same extent by exposure of the polyacetylene films to iodine vapor.

Example 2

The procedure of Example 1 was repeated, but this time employing as the electrolyte a 0.5 M solution of tetra-n-butyl ammonium perchlorate in methylene chloride. The 9-volt potential was applied for a period of 1 hour, during which time the current as measured by the ammeter increased from 0.95 to 3.4 mA. The resulting p-type doped polyacetylene film was found to have the composition $[CH(ClO_4)_{0.0645}]_x$, and a room temperature electrical conductivity of 970 ohm$^{-1}$ cm$^{-1}$.

When the procedures of Examples 1 and 2 were carried out for shorter electrolysis times, the resulting doped polyacetylene films were found to have lower doping levels and correspondingly lower room temperature conductivities in the semiconductor regime.

Example 3

The procedure of Example 1 was repeated, but this time employihg as the electrolyte a 0.3 M solution of $[Pr^n_3NH]^+[AsF_6]^-$ in methylene chloride. The 9-volt potential was applied for a period of 0.75 hour, during which time the current as measured by the ammeter increased from 0.4 to 1.02 mA. The resulting p-type doped polyacetylene film was found by elemental analysis to have a composition corresponding to $[CH(AsF_4)_{0.077}]_x$, and a room temperature electrical conductivity of 553 ohm$^{-1}$ cm$^{-1}$. It is believed that the $AsF_4^-$ ion is formed by a reaction sequence involving proton abstraction from $[Pr^n_3NH]^+$ by fluorine atoms from $AsF_6^-$ during the electrolysis process.

Example 4

The procedure of Example 1 was repeated, but this time employing as the electrolyte a 0.3 M solution of $[Bu^n_4N]^+[SO_3CF_3]^-$ in methylene chloride. The 9-volt potential was applied for a period of 0.5 hour, during which time the current as measured by the ammeter increased from 1.6 to 2.35 mA. The resulting p-type doped polyacetylene film was found to have the composition $[CH(SO_3CF_3)_{0.06}]_x$, and a room temperature electrical conductivity of 255 ohm$^{-1}$ cm$^{-1}$.

Example 5

The procedure of Example 1 was repeated, but this time employing the polyacetylene film as the cathode, and the platinum electrode as the anode of the electrolytic cell, and employing as the electrolyte an essentially saturated solution of lithium iodide in tetrahydrofuran. The 9-volt potential was applied for a period of 0.5 hour, during which time the current as measured by the ammeter increased from 16 to 40 μA. This procedure resulted in the polyacetylene film becoming doped with lithium ions to an n-type material.

EXAMPLE 6

The procedure of Example 5 was repeated, but this time employing as the electrolyte a 1.0 M solution of $[Bu_4^nN]^+[ClO_4]^-$ in tetrahydrofuran, and an applied potential of 4 volts for a period of about 0.25 hour. This procedure resulted in the polyacetylene film becoming doped with $[Bu_4^nN]^+$ to an n-type material having the composition $[(Bu_4^nN)_{0.003}CH]_x$.

EXAMPLE 7

A strip of cis-rich polyacetylene film (1 cm×0.5 cm×0.01 cm, weighing approximately 2 mg) was electrically connected through an ammeter to a strip of lithium foil. The polyacetylene film, acting as a cathode, together with the lithium foil, acting as an anode, were immersed in a 0.3 M $LiClO_4$ electrolyte solution in tetrahydrofuran. The resulting electrochemical cell acted as a battery, exhibitng an open circuit voltage of 1.5 volts, and a short circuit current of 0.5 mA. During discharge of the cell, the polyacetylene film became doped with lithium ions to an n-type material having the composition $(Li_{0.06}CH)_x$.

EXAMPLE 8

The procedure of Example 7 was repeated, but this time employing as the electrolyte solution a 1.0M solution of $[Bu_4^nN]^+[ClO_4]^-$ in tetrahydrofuran. A glass frit was employed to prevent mixing of $[Bu_4^n N]^+$ ions with $Li^+$ ions formed during the cell discharge. The resulting cell acted as a battery, exhibiting an open circuit voltage of 1.3 volts, and a short circuit current of 0.2 mA. During discharge of the cell, the polyacetylene film became doped with $[Bu_4^nN]^+$ to an n-type material having the composition $[(Bu_4^nN)_{0.02}CH]_x$.

After complete discharge of the cells of Examples 7 and 8, the cells were connected to a dc power source, with the positive terminal of the power source being connected to the doped polyacetylene film, and the negative terminal to the lithium foil. When an electrical potential was applied to the resulting electrolytic cells, undoping of the doped polyacetylene films occurred, thereby effecting a recharging of the batteries.

EXAMPLE 9

This example illustrates one embodiment of the novel secondary battery construction in accordance with the present invention, assembled in its charged state.

A disc (7.8 mm in diameter and 50 microns in thickness) of p-type iodide-doped polyacetylene film having the composition $(CHI_{0.08})_x$, was saturated with a saturated solution of lithium iodide in a 50/50 (vol/vol) isopropanol/water solvent. The solvent was then removed under vacuum, thereby leaving the lithium iodide impregnated within the doped polyacetylene film as a solid electrolyte.

The thus-prepared lithium iodide-impregnated doped polyacetylene film disc was then used as the cathode-active material together with lithium as the anode-active material in the assembly of a battery, the assembly steps being carried out in a glove box under a dry atmosphere to avoid the adverse effects of atmospheric moisture on the cell components. The lithium iodide-impregnated doped polyacetylene film disc in surface contact with a lithium metal disc (7.8 mm in diameter and 1 mm in thickness) was sandwiched between two platinum foil disc current collectors (4 mm in diameter and 50 microns in thickness) within a cell body constructed from Plexiglas material, and intimately pressed together using a mechanical press. Platinum wire metal leads (5 mil thickness) spot-welded to the platinum current collectors and extending through the cell body, were provided for external circuit connections.

The resulting battery structure was then tested for its voltage and current outputs under continuous discharge for a period of 20 days through a load resistor of 1,050 ohms, the voltage and current being measured using a Keithley Digital Multimeter. A peak voltage of 2.1 volts and a peak current of 40 $\mu$A was reached within 1 hour. This current level corresponds to an output current per unit area of electrode of 300 $\mu$A/cm$^2$, and to an output current per unit of weight of the battery of 4,000 $\mu$A/g. The energy density of the battery device was found to be 0.06 Wh/g. Since it appears likely that the weight of this battery could be reduced approximately 10-fold, e.g., by reducing the thickness of the lithium metal disc to 100 microns, without any adverse effect on the battery performance, the energy density and output current per unit of weight values achievable with this battery structure should be easily improvable to approximately 0.6 Wh/g and 40,000 $\mu$A/g, respectively.

After 20 days of continuous discharge, the battery device appeared to be heavily drained, producing a voltage of only 0.6 volts and a current of only 0.1 $\mu$A. At this point, the battery device was recharged, using an electrical potential of 9 volts from a DC power supply, for a period of 6 hours. After recharging, the output voltage and current were found to be 2.8 volts and 19 $\mu$A, respectively.

EXAMPLE 10

This example illustrates a modification of the battery embodiment described in Example 9, wherein a semi-hermetically sealed button cell was used to encapsulate the battery components, and which relies solely upon the in situ-formed lithium iodide cell discharge reaction product as its electrolyte.

The entire assembly of the battery components was carried out under an argon atmosphere in a glove box. The button cell comprised a flat-bottom, substantially cup-shaped, aluminum capsule and a teflon cover. A lithium metal disc (4 mm in diameter and 1 mm in thickness) was placed in the open aluminum capsule. Another disc (4 mm in diameter and 50 microns in thickness) of p-type iodide-doped polyacetylene film having the composition $(CHI_{0.2})_x$, was placed directly atop the lithium metal disc. The teflon cover, with a spiral of platinum wire in the center of it, serving as the electrical contact, was then placed over these components. The cell was mechanically sealed to give a semi-hermetic seal. The teflon cover was further sealed with a thin coating of a sealant grease. The cell was then removed from the glove box, and a platinum wire was then attached to the bottom of the aluminum capsule using Electrodag cement. The resulting battery structure was then mounted in 4-probe apparatus, and the apparatus was evacuated.

The battery was tested for its voltage and current outputs under continuous discharge for a period of eight days through a load resistor of 126,000 ohms. A voltage of about 2.0 volts was obtained immediately after assembly. A maximum voltage of about 2.6 volts was observed after sixteen hours, and upon discharge for five days, dropped to about 1.3 volts. From a current versus time plot, the approximate area under the curve represented $1 \times 10^{-4}$ Wh of energy. Assuming a weight of 5 mg for the lithium and iodide-doped polyacetylene discs, this represents an energy density of 0.02 Wh/g. Since the effective electrode area in this cell was about 0.13 cm$^2$, the output current per unit area of electrode, through a load resistor of 126,000 ohms, was about 32 $\mu$A/cm$^2$.

EXAMPLE 11

This example illustrates another embodiment of the novel secondary battery construction in accordance with the present invention, assembled in its discharged state.

The entire assembly of the cell was carried out under an argon atmosphere in a glove box. The materials used for encapsulating the cell components comprised a phenolic threaded sleeve ($\frac{1}{4}$ inch in length), and two stainless steel bolts with the ends polished. One of the stainless steel bolts was screwed into the threaded sleeve, and a disc (6 mm in diameter) of undoped polyacetylene film was placed into the sleeve on top of the stainless steel bolt. A drop of a saturated solution of lithium iodide in tetrahydrofuran was dropped onto the polyacetylene disc. A filter paper disc (6 mm in diameter) was placed atop the polyacetylene disc, and another drop of the lithium iodide solution was dropped onto the filter paper disc. Another disc (6 mm in diameter) of undoped polyacetylene film was then placed atop the filter paper disc, and several more drops of the lithium iodide solution were added. The other stainless steel bolt was then screwed into the threaded sleeve and finger-tightened. The cell assembled in the above manner was then placed in a 4 oz. glass jar having some tetrahydrofuran in it to prevent the cell from drying out.

The cell was then connected with a 9-volt transistor battery, and charged for six minutes. Immediately after such charging operation, the cell was found to have a short-circuit current of 1.6 mA and a short-circuit voltage of 2.8 volts. Using these short-circuit values for the cell, the cell was found to have a current per unit area of electrode of 5.7 mA/cm$^2$, and a power per unit area of electrode of 16 mW/cm$^2$.

When the above cell was then recharged for one hour and then connected to a 126,000 ohm load resistor, an output current of 20 μA and a voltage of 2.7 volts were obtained. This cell was repeatedly charged and discharged, with similar currents and voltages being obtained. From a current versus time plot, the area under the curve represented 7.5×10$^{-4}$ Wh of energy. Assuming a weight of 15 mg for the polyacetylene-filter paper-polyacetylene assembly, this represents an energy density of 0.05 Wh/g. Since the effective electrode area in this cell is about 0.3 cm$^2$, the output current per unit area of electrode is about 60 μA/cm$^2$ through a 126,000 ohm load resistor.

EXAMPLE 12

This example illustrates a modification of the battery embodiment described in Example 11, wherein the lithium iodide was employed in the form of a solid electrolyte.

The cell was constructed in its discharged state as described in Example 11, above. The cell was charged with a 9-volt battery for a period of four minutes, and connected to 126,000 ohm load resistor. A current of 18 μA and a voltage of 2.4 volts were observed. The battery was then almost completely discharged, and thereafter recharged using a 9-volt battery for a period of about 50 minutes. The current and voltage observed was 14 μA and 2.3 volts, respectively, after the charging.

The charged cell was then evacuated for about eight minutes in order to remove the tetrahydrofuran solvent therefrom and leave the lithium iodide remaining therein in the form of a solid electrolyte. The current and voltage values observed for the resulting solid-state cell were 0.2 μA and 0.9 volts, respectively. When this solid-state cell was again charged with a 9-volt battery for about 1.3 hours, a voltage of 1.02 volts and a current of 0.3 μA was observed.

EXAMPLE 13

This example illustrates still another embodiment of the novel secondary battery construction in accordance with the present invention, also assembled in its discharged state.

A disc (8 mm in diameter and 50 microns in thickness) of undoped polyacetylene film was saturated with a saturated solution of lithium iodide in a 50/50 (vol/vol) isopropanol/water solvent. The solvent was then removed under vacuum, thereby leaving the lithium iodide impregnated within the polyacetylene film as a solid electroyte.

The thus-prepared lithium iodide-impregnated polyacetylene film disc was then assembled into a battery, in a glove box under a dry atmosphere, by sandwiching it between two platinum foil disc current collectors (5 mm in diameter and 50 microns in thickness) within a cell body constructed from Plexiglas material. Platinum wire leads (5 mil thickness) spot-welded to the platinum current collectors and extending through the cell body, were provided for external circuit connections.

Preliminary testing was carried out on the resulting secondary battery assembled in its discharged state, merely to con its capability of being converted to a charged state through a solid-state electrochemical doping of the opposite surface layers of the polyacetylene film disc with, respectively, Li+ and I$_3^-$ furnished by the lithium iodide solid electrolyte impregnated within the film. Thus, the secondary battery in its discharged state was connected to a 9-volt battery and charged therewith for a period of four hours. Immediately after such charging operation, the voltage and current outputs of the secondary battery, under discharge through a load resistor of 1,050 ohms, were found to be 0.62 volts and 7.4 μA, respectively, thereby indicating that the secondary battery had been converted to a charged state.

EXAMPLE 14

This example illustrates a modification of the battery construction described in Example 13, employing the lithium iodide in the form of an electrolyte solution, and also employing different materials for encapsulating the battery components.

The entire assembly of the battery components was carried out under an argon atmosphere in a glove box. The materials for encapsulating the battery components comprised a nylon nut (⅜ inch outside diameter and ¼ inch in length) and two stainless steel bolts with their ends polished. One of the stainless steel bolts was screwed into the nylon nut, and a disc (6 mm in diameter) of undoped polyacetylene film was placed within the nut on top of the stainless steel bolt. On to the polyacetylene film disc was dropped one drop of a saturated solution of lithium iodide in tetrahydrofuran. The other bolt was then screwed into the nylon nut, and the resulting assembly placed in a 4 oz. glass containing some tetrahydrofuran.

The resulting secondary battery assembled in its discharged state was then charged with a 9-volt battery for about three seconds, and was then connected to a 126,000 ohm load resistor. The resulting charged battery was found to have an output current of 7 μA and a voltage of 0.9 volts.

EXAMPLE 15

This example illustrates another embodiment of the novel secondary battery construction in accordance with the present invention, assembled in its charged state.

A strip of cis-rich polyacetylene film (0.5 cm×1.0 cm×0.01 cm) was pre-doped in accordance with the procedure of Example 2 to a p-type perchlorate-doped polyacetylene having the composition [CH(ClO$_4$)$_{0.06}$]$_x$. The perchlorate-doped polyacetylene film strip (weighing approximately 3 mg) was used as a cathode in combination with a lithium foil anode, (0.5 cm×2 cm×0.1 cm, weighing approximately 5 mg), both of which were immersed in a 0.3 M LiClO$_4$ electrolyte solution in propylene carbonate. The resulting battery exhibited an open circuit voltage of 3.7 volts and a short circuit current of approximately 25 mA. The discharge voltages and currents after several minutes short circuit discharge were as follows: after 0.5 minutes, V$_{oc}$=3.6 volts and I$_{sc}$=4 mA; after 1 minute, V$_{oc}$=3.3 volts and I$_{sc}$=2 mA; and after 3.5 minutes, V$_{oc}$=1.3 volts and I$_{sc}$=0.3 mA. The short circuit discharge studies indicated an energy density of approximately 80 wh/lb and an initial power density of approximately 750 w/lb, based on the combined weight of the anode and cathode materials.

The battery was recharged by connecting it to a dc power source, with the positive terminal of the power source being connected to the polyacetylene film, and the negative terminal to the lithium foil, and applying a potential of 4 volts for about 30 minutes. To the accuracy of the measurements, the polyacetylene electrode was found to be reversible with no observable degradation after a number of charge/discharge cycles. For example, after twenty charge and twenty discharge cycles at constant currents varying from 0.1 to 1.0 mA, the polyacetylene electrode showed no change in its charging or discharging characteristics. Furthermore, no change in discharging characteristics was observed after the charged battery had been permitted to stand for 48 hours.

The battery of this example also can be suitably assembled in its uncharged state, employing the polyacetylene film cathode in undoped form, and subsequently charged in situ by the same procedure described above for its recharging. In this case, the lithium foil anode could be replaced with any compatible metal, such as aluminum foil or platinum, on which lithium metal from the $LiClO_4$ electrolyte could deposit during the charging reaction. Such deposited lithium metal would then be consumed back into the electrolyte during the discharging reaction. The resulting $V_{oc}$ and $I_{sc}$ values would be somewhat less than those obtained with the lithium foil anode embodiment.

EXAMPLE 16

A battery was assembled similar to the battery described in Example 15, but employing a p-type perchlorate-doped polyacetylene film having the composition $[CH(ClO_4)_{0.05}]_x$ as the cathode, an n-type lithium-doped polyacetylene film having the composition $[Li_{0.05}CH]_x$ as the anode, and 0.3 M $LiClO_4$ in tetrahydrofuran as the electrolyte. The resulting battery exhibited an open circuit voltage of 3.1 volts, and a short circuit current of 1.9 mA.

EXAMPLE 17

A battery was assembled similar to the battery described in Example 16, but employing an n-type $[Bu_4{}^nN]^+$-doped polyacetylene film having the composition $[(Bu_4{}^nN)_{0.05}CH]_x$ as the anode, and 0.3M tetra-n-butyl ammonium perchlorate in tetrahydrofuran as the electrolyte. The resulting battery exhibited an open circuit voltage of 2.8 volts, and a short circuit current of 3.5 mA.

EXAMPLE 18

A battery was assembled similar to the battery described in Example 17, but employing a p-type perchlorate-doped polyacetylene film having the composition $[CH(ClO_4)_{0.09}]_x$ as the cathode, an n-type $[Bu_4{}^nN]^+$-doped polyacetylene film having the composition $[(Bu_4{}^nN)_{0.07}CH]_x$ as the anode, and 0.5 M tetra-n-butyl ammonium perchlorate in propylene carbonate as the electrolyte. The resulting battery exhibited an open circuit voltage of 2.5 volts, and a short circuit current of 16.0 mA.

EXAMPLE 19

A battery was assembled similar to the battery described in Example 16, but employing a p-type perchlorate-doped polyacetylene film having the composition $[CH(ClO_4)_{0.02}]_x$ as the anode, and 0.5 M tetra-n-butyl ammonium perchlorate in propylene carbonate as the electrolyte. The resulting battery exhibited an open circuit voltage of 0.5 volts, and a short circuit current of 0.3 mA.

EXAMPLE 20

A battery was assembled similar to the battery described in Example 18, but employing an n-type $[Bu_4{}^nN]^+$-doped polyacetylene film having the composition $[(Bu_4{}^nN)_{0.02}CH]_x$ as the cathode. The resulting battery exhibited an open circuit voltage of 0.66 volts, and a short circuit current of 1.9 mA.

EXAMPLE 21

A battery was assembled similar to the batteries described in Examples 17 and 18, but employing a p-type hexafluorophosphate-doped polyacetylene film having the composition $[CH(PF_6)_{0.06}]_x$ as the cathode, an n-type $[Bu_4{}^nN]^+$-doped polyacetylene film having the composition $[(Bu_4{}^nN)_{0.06}CH]_x$ as the anode, and 0.3 M tetra-n-butyl ammonium hexafluorophosphate in tetrahydrofuran as the electrolyte. The resulting battery exhibited an open circuit voltage of 2.5 volts, and a short circuit current of 4.1 mA.

EXAMPLE 22

A battery was assembled in its uncharged state by inserting between two stainless steel electrode current collectors two discs of undoped polyacetylene film (1 cm in diameter and 100 microns in thickness) as the cathode-active and anode-active materials, respectively, separated by a piece of glass filter paper all the components impregnated with 0.1 M sodium iodide in solid polyethylene oxide as a solid electrolyte. The battery was converted to its charged state by connecting it to a dc power source, with the positive terminal of the power source being connected to the battery cathode, and the negative terminal to the battery anode, and applying a potential of 4 volts for about 30 minutes. The charging procedure resulted in the polyacetylene film becoming doped with $I_3{}^-$ anions to a p-type material having the composition $[CH(I_3)_{0.001}]_x$, and the polyacetylene anode film becoming doped with $Na^+$ cations to n-type material having composition $[Na_{0.003}(CH)]_x$. The resulting charged battery, with the p-doped polyacetylene film serving as its cathode-active material and the n-doped polyacetylene film as its anode-active material, exhibited an open circuit voltage of 1.3 volts, and a short circuit current of 1 mA.

In all of the above illustrative examples, the open circuit voltage and short circuit current values given represent, unless otherwise indicated, the values obtained upon initial discharge of the charged battery.

The embodiments of the invention in which an exclusive property or privilege is claimed are defined as follows:

1. A secondary battery comprising an anode means, a cathode means, and an electrolyte each of said electrode means including as an electrode-active material thereof a conjugated polymer which is characterized by having conjugated unsaturation along a main backbone chain thereof, said polymer being electrochemically oxidizable to a p-type doped material and electrochemically reducible to an n-type doped material, said electrolyte comprising a compound which is ionizable into one or more anionic or cationic dopant species capable of doping said polymer to one of said oxidized or reduced states.

2. The battery of claim 1, wherein the anode-active conjugated polymer and the cathode-active conjugated polymer are opposite surfaces of the same unitary mass of conjugated polymer, and said electrolyte is impregnated within said conjugated polymer.

3. The battery of claim 1, wherein the anode-active conjugated polymer and the cathode-active conjugated polymer are each in substantially the same oxidation state.

4. A secondary battery comprising an anode means, a cathode means, and an electrolyte, each of said electrode means including as an electrode-active material thereof a conjugated polymer which is characterized by having conjugated unsaturation along a main backbone chain thereof, said polymer being electrochemically oxidiazable to a p-type doped material and electrochemically reducible to an n-type doped material, said polymer being doped with a cationic dopant species to an n-type electrically conducting material wherein the anode-active material is said cation-doped conjugated polymer and the cathode-active material is said conjugated polymer in a higher oxidation state than the anode-active, cation-doped polymer.

5. The battery of claim 4, wherein said cathode-active material is a conjugated polymer doped with an anionic dopant species to a p-type electrically conducting material.

6. The battery of claim 4, wherein said anode-active material and said cathode-active material are each said cation-doped conjugated polymer but having different degrees of doping, said anode-active cation-doped conjugated polymer having a higher degree of doping than said cathode-active cation-doped conjugated polymer.

7. The battery of claim 4 wherein said anode-active material and said cathode-active material are formed respectively as the two opposite surface layers of a three-layered unitary mass of conjugated polymer whose central layer constitutes said conjugated polymer impregnated with said electrolyte and in an oxidation state intermediate between those of said anode-active and cathode-active materials.

8. A secondary battery comprising an anode means, a cathode means, and an electrolyte, each of said electrode means including as an electrode-active material thereof a conjugated polymer which is characterized by having conjugated unsaturation along a main backbone chain thereof, said polymer being electrochemically oxidizable to a p-type doped material and electrochemically reducible to an n-type doped material, said polymer being doped with an anionic dopant species to a p-type electrically conducting material wherein the cathode-active material is said anion-doped conjugated polymer, and the anode-active material is said conjugated polymer in a lower oxidation state than the cathode-active, anion-doped conjugated polymer.

9. The battery of claim 8, wherein said anode-active material and said cathode-active material are each said anion-doped conjugated polymer but having different degrees of doping, said cathode-active anion-doped conjugated polymer having a higher degree of doping than said anode-active anion-doped conjugated polymer.

10. The battery of claim 8, wherein said anode-active material and said cathode-active material are formed respectively as the two opposite surface layers of a three-layered unitary mass of conjugated polymer whose central layer constitutes said conjugated polymer impregnated with said electrolyte and in an oxidation state intermediate between those of said anode-active and cathode-active materials.

11. A secondary battery comprising an anode means, a cathode means, and an electrolyte, said electrolyte comprising a compound which is ionizable into one or more ionic dopant species selected from the group consisting of an anionic dopant species and a cationic dopant species, each of the anode means and cathode means including as an electrode-active material thereof a conjugated polymer which is characterized by having conjugated unsaturation along a main backbone chain thereof and which is dopable either with said anionic dopant species to a higher oxidation state or with said cationic dopant species to a lower oxidation state.

12. The battery of claim 11, wherein the anode-active conjugated polymer and the cathode-active conjugated polymer are opposite surfaces of the same unitary mass of conjugated polymer, and said electrolyte is impregnated within said conjugated polymer.

13. The battery of claim 11, wherein the anode-active conjugated polymer and the cathode-active conjugated polymer are each in substantially the same oxidation state.

14. A secondary battery comprising an anode means, a cathode means, and an electrolyte, each of the anode means and cathode means including as an electrode-active material thereof a conjugated polymer which is characterized by having conjugated unsaturation along a main backbone chain thereof and where the anode-active material is said polymer doped with a cationic dopant species to an n-type electrically conducting material and the cathode-active material is a conjugated polymer in a higher oxidation state than the anode-active cation-doped conjugated polymer.

15. The battery of claim 14, wherein said cathode-active material is a conjugated polymer doped with an anionic dopant species to a p-type electrically conducting material.

16. The battery of claim 14, wherein said anode-active material and said cathode-active material are each said cation-doped conjugated polymer but having different degrees of doping, said anode-active cation-doped conjugated polymer having a higher degree of doping than said cathode-active cation-doped conjugated polymer.

17. The battery of claim 14, wherein said anode-active material and said cathode-active material are formed respectively as the two opposite surface layers of a three-layered unitary mass of conjugated polymer whose central layer constitutes said conjugated polymer impregnated with said electrolyte and in an oxidation state intermediate between those of said anode-active and cathode-active materials.

18. A secondary battery comprising an anode means, a cathode means, and an electrolyte, each of the anode means and cathode means including as an electrode-active material thereof a conjugated polymer which is characterized by having conjugated unsaturation along a main backbone chain thereof and where the cathode-active material is said polymer species is anion-doped to a p-type electrically conducting material and the anode-active material is a conjugated polymer in a lower oxidation state than the cathode-active anion-doped conjugated polymer.

19. The battery of claim 18, wherein said anode-active material and said cathode-active material are each said anion-doped conjugated polymer but having different degrees of doping, said cathode-active anion-doped conjugated polymer having a higher degree of doping than said anode-active anion-doped conjugated polymer.

20. The battery of claim 18, wherein said anode-active material and said cathode-active material are formed respectively as the two opposite surface layers of a three-layered unitary mass of conjugated polymer whose central layer constitutes said conjugated polymer impregnated with said electrolyte and in an oxidation state intermediate between those of said anode-active and cathode-active materials.

* * * * *